(12) United States Patent
Gardner et al.

(10) Patent No.: US 6,417,539 B2
(45) Date of Patent: Jul. 9, 2002

(54) HIGH DENSITY MEMORY CELL ASSEMBLY AND METHODS

(75) Inventors: Mark I. Gardner, Cedar Creek; Derick J. Wristers, Austin; Jon Cheek, Round Rock, all of TX (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/128,864

(22) Filed: Aug. 4, 1998

(51) Int. Cl.[7] .................. H01L 29/76; H01L 29/788
(52) U.S. Cl. .................. 257/316; 257/314; 257/315
(58) Field of Search .................. 257/296–324; 438/250–266, 396–398

(56) References Cited

U.S. PATENT DOCUMENTS

| | | | | |
|---|---|---|---|---|
| 5,508,881 A | * | 4/1996 | Stevens | 257/532 |
| 5,587,668 A | * | 12/1996 | Shibata et al. | 326/36 |
| 5,760,432 A | * | 6/1998 | Abe et al. | 257/295 |
| 5,828,099 A | * | 10/1998 | Van Dort et al. | 257/314 |
| 5,838,032 A | * | 11/1998 | Ting | 257/306 |

FOREIGN PATENT DOCUMENTS

JP          407312394 A  * 11/1995

OTHER PUBLICATIONS

Wolf, S., *Silicon Processing for the VLSI Era*, vol. II: Process Integration, pp. 567–638, copyright 1990.

* cited by examiner

Primary Examiner—Tom Thomas
Assistant Examiner—Cuong Q Nguyen (57) ABSTRACT

A memory cell assembly includes a substrate, a first electrode, and a second electrode layer. The first electrode is disposed over the substrate and the second electrode layer is disposed over the first electrode. The second electrode layer includes two or more second electrodes. Dielectric material separates the first electrode form the second electrodes and also separates the second electrodes. Each second electrode forms an individual memory cell associated with the first electrode. The memory cell assembly can be made by, first, forming a first electrode over a substrate. A second electrode layer is formed over the first electrode. The second electrode layer includes two or more second electrodes. A dielectric material is formed between the first electrode and the second electrodes and between the second electrodes.

41 Claims, 5 Drawing Sheets

HIGH DENSITY MEMORY CELL ASSEMBLY AND METHODS

FIELD OF THE INVENTION

The present invention is directed to memory cell assemblies and methods of forming and using the memory cells, and more particularly, to high density memory cell assemblies including a single first electrode and a plurality of second electrodes and methods of forming and using the memory cells.

BACKGROUND OF THE INVENTION

Over the last few decades, the electronics industry has undergone a revolution by the use of semiconductor technology to fabricate small, highly integrated electronic devices. The most common semiconductor technology presently used is silicon-based. A large variety of semiconductor devices have been manufactured having various applications in numerous disciplines. One such application is for memory cells. A variety of memory cell types have been developed including, for example, random access memory (RAM), read-only memory (ROM), and programmable read-only memory (PROM). ROM and PROM memory cells are typically used to store information that can be accessed quickly, however, programming of PROM memory cells is often much slower than for RAM memory cells.

A variety of PROM memory cells have been developed which allow for reprogramming. Among the most useful are flash memory cells and electrically erasable PROM (EEPROM) cells. The programming of these memory cells can be erased, for example, by sending an electrical signal through the cells. A review of different types and configurations for these memory cells is provided in S. Wolf, *Silicon Processing for the VLSI Era*, Vol. 2: Processing Integration, pp. 567–638, incorporated herein by reference.

Many memory cells include, as a base component, a metal-oxide-semiconductor (MOS) transistor. The MOS transistor is used as one of the basic building blocks of many modem electronic circuits. Thus, such circuits realize improved performance and lower costs as the performance of the MOS transistor is increased and as the manufacturing costs are reduced.

Figure 1:
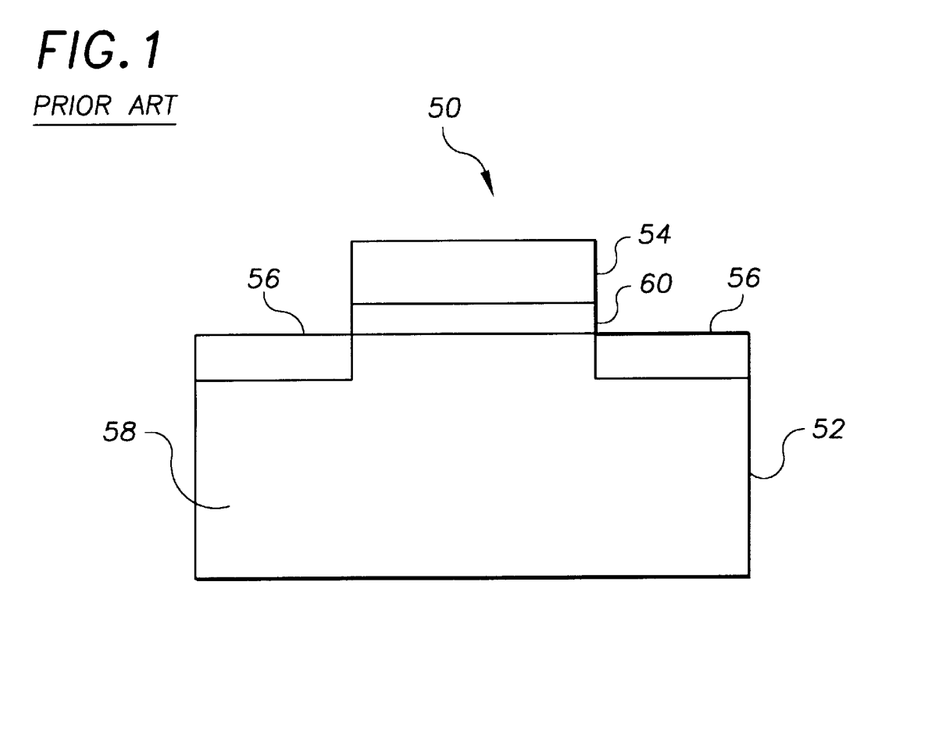
FIG. 1 illustrates a prior art MOS device.

A typical MOS semiconductor device 50 suitable for a memory cell generally includes a semiconductor substrate 52 on which a gate electrode 54 is disposed, as shown in FIG. 1. The gate electrode 54, which acts as a conductor, receives an input signal to control operation of the device.

Source and drain regions 56 are typically formed in regions of the substrate adjacent the gate electrode by heavily doping these regions with a dopant material of a desired conductivity. The conductivity of the doped region depends on the type of impurity used to dope the region. The collective term source/drain region is used herein to generally describe an active region used for the formation of either a source or drain.

A channel region 58 is formed in the semiconductor substrate beneath the gate electrode 54 and between the source and drain regions 56. The channel is often lightly doped with a dopant material having a conductivity type opposite to that of the source and drain regions. The gate electrode is generally separated from the substrate by an insulating layer 60, typically an oxide layer such as $SiO_2$. The insulating layer is provided to restrain current from flowing between the gate electrode 54 and the source, drain or channel regions 56, 58.

MOS devices typically fall in one of two groups depending on the type of dopant materials used to form the source, drain and channel regions. The two groups are often referred to as n-channel and p-channel devices. The type of channel is identified based on the conductivity type of the channel which is developed under the transverse electric field. In an n-channel MOS (NMOS) device, for example, the conductivity of the channel under a transverse electric field is of the conductivity type associated with n-type impurities (e.g., arsenic or phosphorous). Conversely, the channel of a p-channel MOS (PMOS) device under the transverse electric field is associated with p-type impurities (e.g., boron).

One type of conventional memory cell is prepared from the MOS device by disposing a second electrode over the gate electrode. The memory cell device is programmed by applying a potential between the gate electrode and the second electrode that transfers holes or electrons from one electrode to the other to define one state (e.g., a "1" state). The absence of transferred charge indicates the other state (e.g., a "0" state).

There is a desire to decrease the size of electronic components and, in particular, to increase the density of memory cells for a given device size. In part, this is accomplished by decreasing the size of the base MOS device. However, there is a need for the development of other methods for increasing the density of memory cells and for devices with increased memory cell density.

SUMMARY OF THE INVENTION

Generally, the present invention relates to semiconductor devices, memory cells, and methods of forming memory cells from semiconductor devices. One embodiment of the invention is a memory cell assembly that includes a substrate, a first electrode, and a second electrode layer. The first electrode is disposed over the substrate and the second electrode layer is disposed over the first electrode. The second electrode layer includes two or more second electrodes. Dielectric material separates the first electrode from the second electrodes and also separates the second electrodes. Each second electrode forms an individual memory cell associated with the first electrode.

Another embodiment is a method of making a memory cell. A first electrode is formed over a substrate. A second electrode layer is formed over the first electrode. The second electrode layer includes two or more second electrodes. A dielectric material is formed between the first electrode and the second electrodes and between the second electrodes.

A further embodiment is a method of making a memory cell. An insulation layer is formed over a portion of a substrate and a first electrode is formed over the insulating layer. A first dielectric layer is formed over the first electrode. Portions of the first dielectric layer are removed to form a plurality of gaps in the first dielectric layer and exposing a plurality of isolated regions of the first electrode, leaving a remaining portion of the first dielectric layer between the plurality of gaps. A second dielectric layer is formed over the plurality of isolated regions of the first electrode. A second electrode layer is formed over the second dielectric layer and within the plurality of gaps. The second electrode layer forms a plurality of second electrodes separated by the remaining portion of the first dielectric layer.

The above summary of the present invention is not intended to describe each illustrated embodiment or every implementation of the present invention. The Figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE VARIOUS EMBODIMENTS

The present invention is believed to be applicable to formation of semiconductor devices. The invention is particularly suited for the formation of semiconductor devices used as memory cell assemblies. While the present invention is not so limited, an appreciation of various aspects of the invention will be gained through a discussion of the various application examples operating in such environments.

Figure 2A:
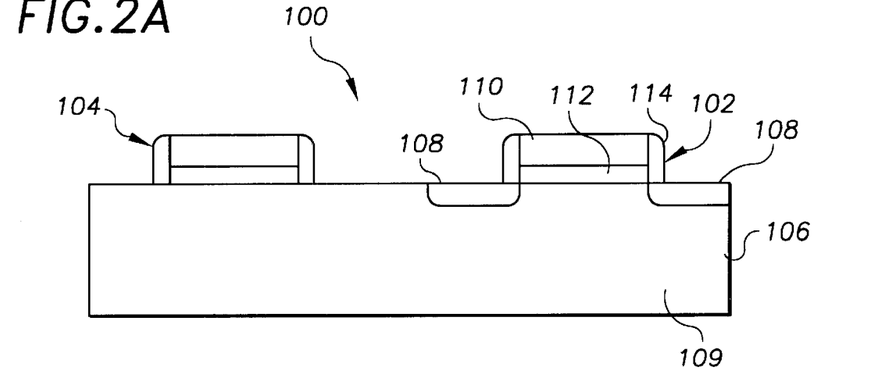
FIGS. 2A to 2F illustrate an exemplary fabrication process in accordance with an embodiment of the invention.

FIGS. 2A–2F illustrate one exemplary method of forming a memory cell assembly 100 with two or more memory cells. Formation of the memory cell assembly 100 typically includes the formation of a MOS semiconductor device 102, as shown in FIG. 2A. The MOS semiconductor device 102 can be NMOS or PMOS. A second MOS semiconductor device 104 for use as a transistor, for example, as a switching transistor for the memory cell assembly, is also shown for comparison. The MOS semiconductor device 102 includes a substrate 106 with active regions 108, a channel region 109 separating the active regions 108, a first electrode 110 (i.e., gate electrode) over the channel region 109, an insulating layer 112 for insulating the first electrode 110 from the channel region 109, and optional spacer structures 114 disposed on the sides of or adjacent to the first electrode 110. It will be understood that the MOS semiconductor device 102 can be formed using any of a variety of known techniques.

The substrate 106 is typically a semiconductor material and can be, for example, silicon. Portions of the substrate 106 are doped with a dopant material to form active regions 108 which act as the source and drain of the MOS semiconductor device 102. The active regions can be doped using a variety of materials and a variety of dopant concentrations and implant energies. N-type dopant materials include, for example, arsenic and phosphorus and P-type dopant materials include, for example, boron and boron compounds, such as boron hydride and boron halides.

The first electrode 110 can be formed using a variety of materials including, for example, metals (e.g., aluminum, copper, tungsten, and titanium) or polysilicon. A polysilicon first electrode may be particularly useful if later processing procedures include high temperatures that could damage a metal structure. A variety of methods for formation of metal and polysilicon are known and may be used.

The length of the first electrode 110 (i.e., gate electrode) is often related to the design rules used to form the semiconductor device. Typically, the first electrode 110 can have a length ranging from, for example, 0.15 $\mu$m to 0.5 $\mu$m, however, larger or smaller first electrodes may also be used. The thickness of the first electrode 110 can range from, for example, 500 angstroms to 3000 angstroms, however, thinner or thicker first electrodes can be used.

In the memory cell assembly 100, the first electrode 110 is typically the gate electrode of the MOS semiconductor device. The first electrode can be used to either charge or discharge a second electrode 126 (see FIG. 2F). The presence of charge on one of the first and second electrodes typically corresponds to one logical state (e.g., a "1" binary state) and the absence of charge corresponds to another logical state (e.g., a "0" binary state).

The insulating layer 112 can be made using a variety of dielectric materials including, for example, silicon dioxide ($SiO_2$) and silicon oxynitride ($SiO_xN_y$). Other dielectric materials may be used for the insulating layer. The insulating layer can be made by a variety of methods including, for example, thermal oxidation of the substrate 106 in an inert, oxygen-, or nitrogen-bearing (e.g., NO or $N_2O$) ambient, chemical vapor deposition (CVD) of a dielectric material (e.g., tetraethyl orthosilicate (TEOS)), or physical vapor deposition. The thickness of the insulating layer 112 ranges from, for example, 15 to 200 angstroms, however, thinner or thicker insulating layers can be used.

The optional spacers 114 are typically formed using a dielectric material, such as, for example, silicon oxide, silicon nitride, and silicon oxynitride. Methods for forming the spacers 114 are known in the art and include, for example, thermal oxidation of the gate electrode 110 and chemical vapor deposition of a dielectric material over the first electrode 110 and substrate 106 followed by an anisotropic etch to leave the spacers 114. The spacers can have a thickness, measured from the sidewall of the gate electrode 104 to the outer sidewall of the spacer 114, ranging from, for example, 300 angstroms to 1000 angstroms, although thicker or thinner spacers may be used. In some embodiments, there are no spacers.

Figure 2B:
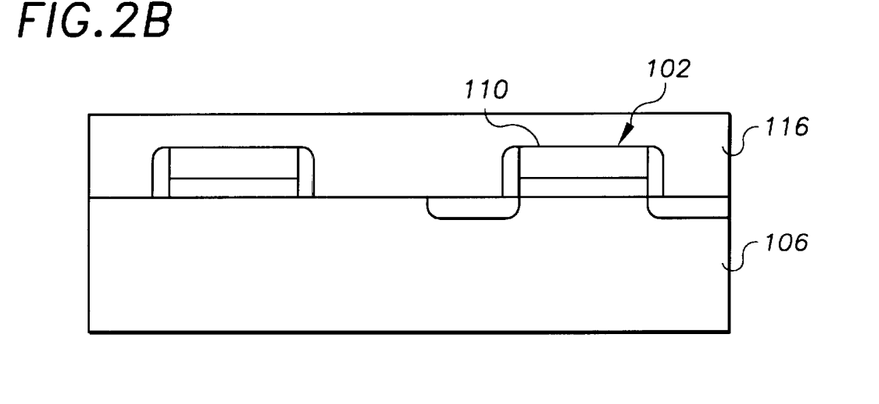

After formation of the first electrode 110, a first dielectric layer 116 is formed over the first electrode 110, as shown in FIG. 2B. The first dielectric layer 116 can be formed by a variety of methods including, for example, chemical vapor deposition, physical vapor deposition, spin-on glass deposition, and the like. The first dielectric layer 116 can be formed using a variety of materials including, for example, silicon dioxide, silicon oxynitride, silicon nitride, spin-on glass, hydrogen silsesquioxane (HSQ), and TEOS. Typically, the first dielectric layer 116 is formed having a thickness, measured as the height of the top surface of the first dielectric layer 116 above the first electrode 110, of at least, for example, about 500 angstroms. The thickness of the first dielectric layer 116 above the first electrode 110 can range from, for example, 500 to 3500 angstroms. However, thicker or thinner first dielectric layers 116 can be used.

Figure 2C:
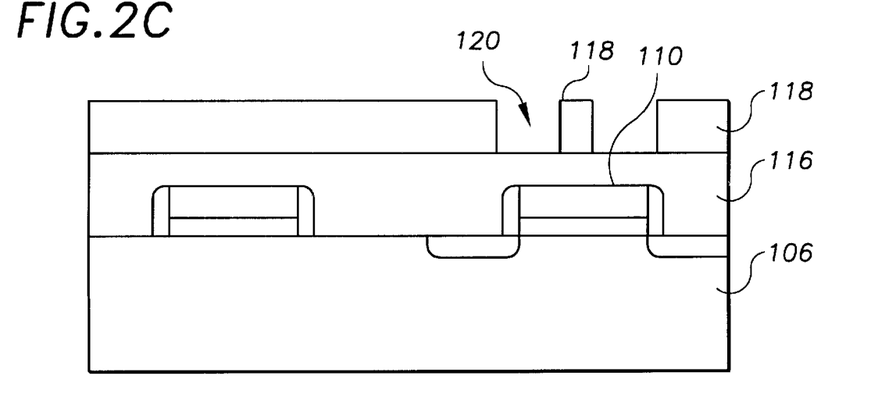

After formation of the first dielectric layer 116, a photoresist layer 118 is deposited over the first dielectric layer as shown in FIG. 2C. The photoresist layer 118 is patterned using, for example, photolithographic techniques. A portion of the photoresist layer 118 is removed according to the pattern to expose the surface of two or more portions of the first dielectric layer 116.

Figure 2D:
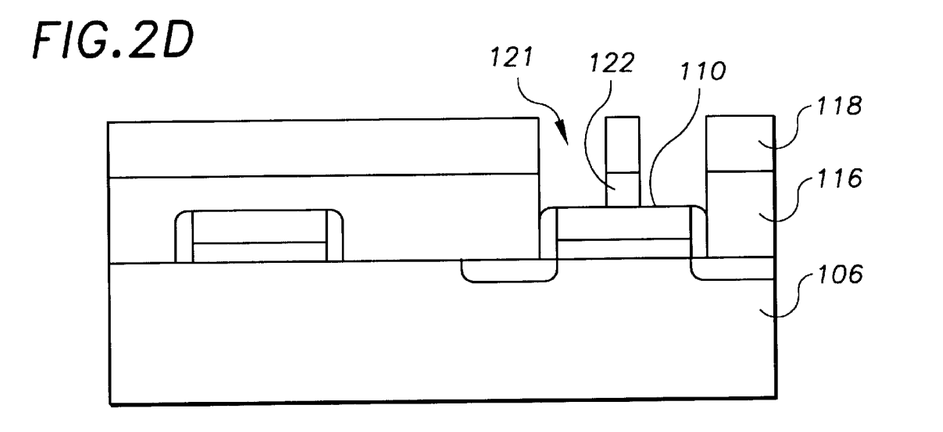
Figure 2E:
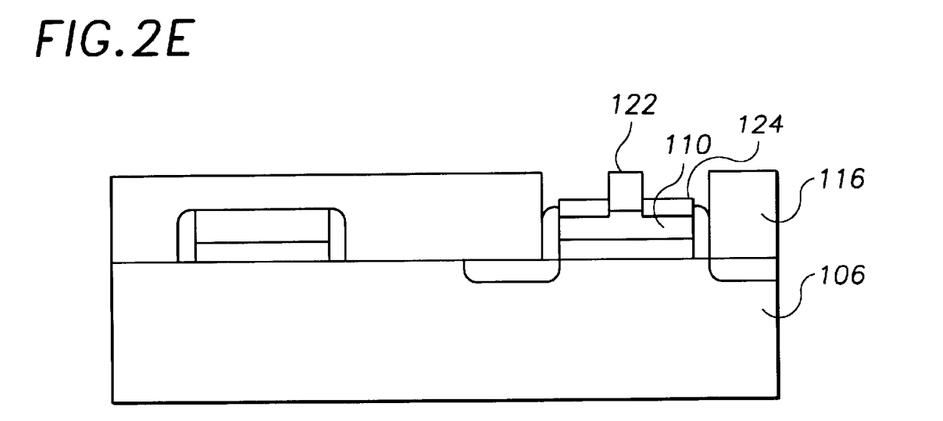
Figure 2F:
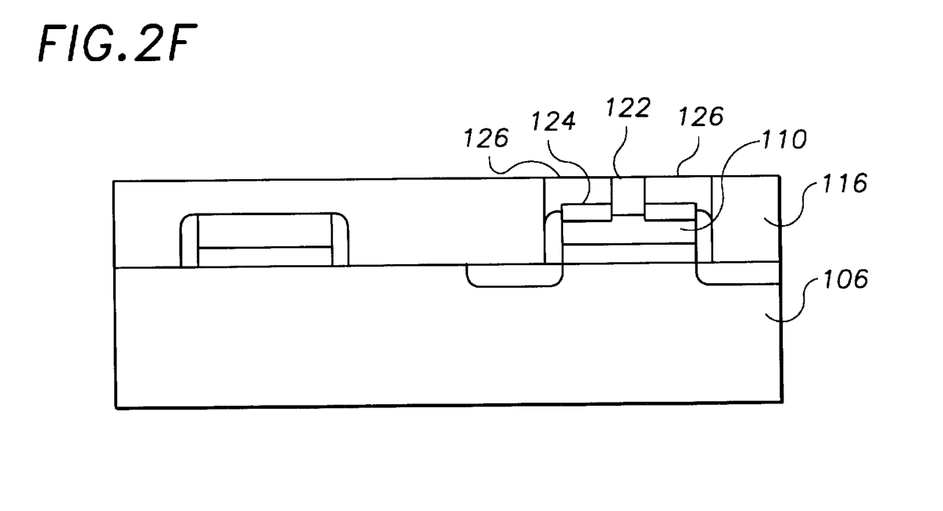

The pattern formed in the photoresist layer 118 typically corresponds to a desired pattern for two or more second electrodes 126 (see FIG. 2F). The two or more second electrodes 126 are all formed directly over and may extend slightly beyond the underlying first electrode 110 (see FIG. 2C). A portion of the first dielectric layer 116 is left between and around each of the two or more second electrodes 126 to isolate the second electrodes 126. Each of the second electrodes 126 corresponds to an individual memory cell.

Figure 3A:
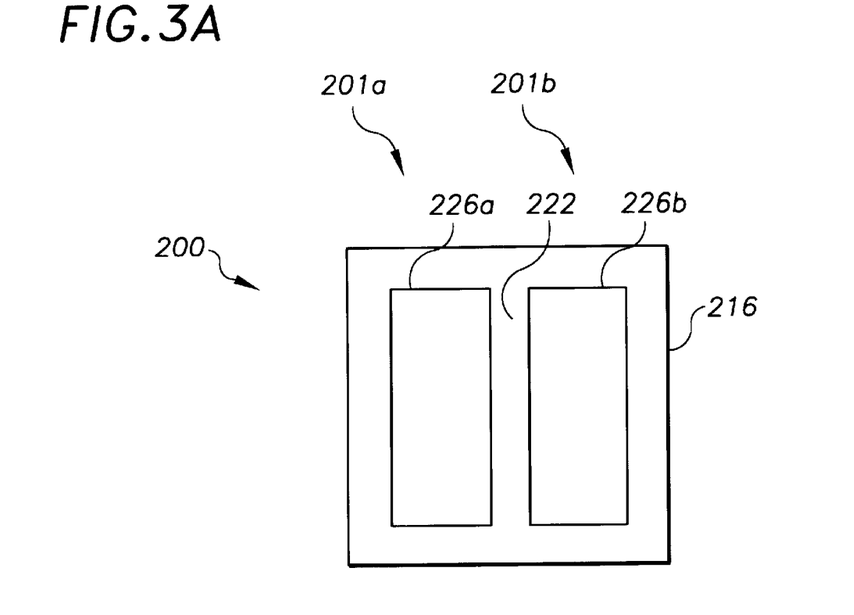
FIGS. 3A and 3B are top views of two exemplary embodiments of a memory cell assembly according to the invention.
Figure 3B:
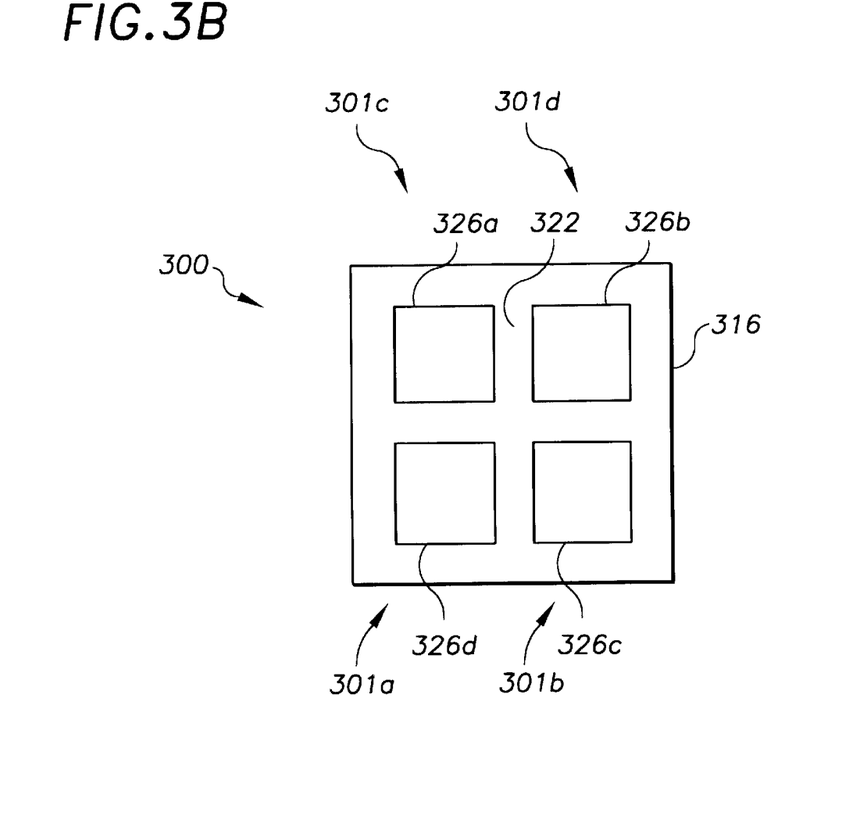

Exemplary patterns for the second electrodes are illustrated in FIGS. 3A and 3B. The embodiment illustrated in FIG. 3A includes two memory cells 201*a*, 201*b* formed using a single first electrode. The embodiment illustrated in FIG. 3B includes four memory cells 301*a*, 301*b*, 301*c*, 301*d* formed using a single first electrode. Although, the region above the first electrode is illustrated as having two or four independent second electrodes, it will be understood that any number of second electrodes can be formed. Moreover, it will be understood that all of the second electrodes do not necessarily have identical cross-sectional surface areas, although it may be preferable to have second electrodes with similar cross-sectional surface areas for memory cell uniformity.

Returning to FIGS. 2A–2F, the portions of the first dielectric layer 116 exposed by removal of the portion of the photoresist layer 118 according to the pattern are then removed to form two or more gaps 120 in the first dielectric layer 116, as shown in FIG. 2D. These gaps are separated by a dielectric barrier 122 which is typically a portion of the first dielectric layer 116.

The portions of first dielectric layer 116 can be removed by a variety of techniques including, for example, wet etching, dry etching, and anisotropic etching. Typically, anisotropic etching is preferred because this technique often results in gaps 121 that have vertical walls. The gaps 121 in the first oxide layer 116 often extend laterally beyond the boundary of the first electrode 110 and may extend across a portion, or all, of the spacers 114 or even beyond the spacers 114. In some alternative embodiments, the gaps in the first dielectric layer do not extend laterally beyond the boundary for the first electrode 110.

The width of the dielectric barrier 122, measured as the minimum distance separating the gaps 120, can range from, for example, 100 to 200 angstroms. However, wider or narrower dielectric barriers 122 may be left between the gaps 120. Oxynitrides are particularly suitable for the lower portion of the range.

The width of the dielectric barrier 122 and the dielectric constant of the material of the dielectric barrier 122 often determines, at least in part, a memory cell breakdown voltage. The memory cell breakdown voltage corresponds to a potential difference between to second electrodes that results in the transfer of electrons and/or holes from one of the second electrodes 126 to another (i.e., from one memory cell to another). Typically, the width and material of the dielectric barrier 122 is chosen so that the memory cell breakdown voltage is greater than the typical operating voltage of the memory cell. The memory cell breakdown voltage is also typically greater than a voltage used to program the memory cell (as described below). The memory cell breakdown voltage can range from, for example, 15 to 20 volts. Lower or higher memory cell breakdown voltages may also be used.

The photoresist layer 118 is removed and a second dielectric layer 124 is formed on the exposed regions of the first electrode 110 within the gaps 120 to provide an electrode insulating layer, as shown in FIG. 2E. The second dielectric layer 124 can be formed using a variety of different dielectric materials, including, for example, oxides (e.g., silicon dioxide) and oxynitrides (e.g., silicon oxynitride). The second dielectric layer 124 can be formed by a variety of methods including, for example, thermal oxidation of the exposed first electrode 110 (providing the first electrode is silicon) to form an oxide, thermal oxidation in a nitrogen-bearing (e.g., HNO, NO, or $N_2O$) ambient to form an oxynitride, thermal oxidation to form an oxide followed by an NO anneal to form an oxynitride, chemical vapor deposition, or physical vapor deposition. The thickness of the second dielectric layer 124 can range from, for example, 40 to 150 angstroms.

In other embodiments (not shown), a portion of the first dielectric layer is left over the first electrode. This portion of the first dielectric layer may be used as an electrode insulating layer, insulating the first electrode from the subsequently formed second electrodes, and can have a thickness ranging from, for example, 40 to 150 angstroms. Additional dielectric material may optionally be deposited on the remaining first dielectric layer to increase the thickness to, for example, 40 to 150 angstroms above the first electrode.

Moreover, in some embodiments, a silicon nitride or silicon oxynitride layer (not shown) is formed over the first electrode 110 and/or the second dielectric layer 124. The silicon nitride or silicon oxynitride layer often helps stabilize the memory cell assembly 100. This silicon nitride or silicon oxynitride layer can be formed by a variety of methods including, for example, thermal oxidation in a nitrogen-bearing ambient, chemical vapor deposition, or physical vapor deposition. The thickness of the silicon nitride or silicon oxynitride layer is typically about 10 to 30 angstroms. The presence of a silicon nitride or silicon oxynitride layer (not shown) can permit a decrease in the thickness of the second dielectric layer 124 of, for example, 10 to 100 angstroms so that the second dielectric layer 124 has a thickness ranging from, for example, 40 to 100 angstroms.

The silicon nitride or silicon oxynitride layer can be formed at any of a number of points within the process flow illustrated in FIGS. 2A–2F. For example, the silicon nitride or silicon oxynitride layer could be formed directly over the first electrode prior to deposition of the first dielectric layer. Alternatively, the silicon nitride or silicon oxynitride layer can be formed over the exposed portions of the gate electrode after the formation of the gaps in the first dielectric layer, but prior to the formation of the second dielectric layer. In another embodiment, the silicon nitride or silicon oxynitride layer can be formed over the second dielectric layer prior to the formation of the second electrodes.

Returning to FIGS. 2A–2F, following the formation of the second dielectric layer 124, conductive material is deposited into the gaps 120 in the first oxide layer 116 to form two or more second electrodes 126 in a second electrode layer, as shown in FIG. 2F. A variety of conductive materials can be used including, for example, polysilicon and metals such as copper, aluminum, tungsten, or titanium. Metal second electrodes may be particularly useful if the subsequent processing steps do not include high temperatures that can distort or damage the electrodes.

The second electrodes can be formed by a variety of techniques, including, for example, chemical vapor deposition, physical vapor deposition, or sputtering. The conductive material typically fills the gaps 120 and may extend beyond the gaps. The conductive material may then be polished to planarize the surface and to remove excess conductive material outside of the gaps 120. Suitable techniques for polishing the conductive material include, for example, chemical, mechanical, and chemical-mechanical polishing.

A portion of each of the second electrodes 126 is directly above the first electrode 110, but separated by the electrode insulating layer 124. Each second electrode 126 forms an individual capacitive element with the first electrode 110. This capacitive element is capable of being individually programmed, thereby forming an independent memory cell. Thus, two or more memory cells can be formed using a single first electrode 110. An advantage of the embodiment in which the second electrodes 126 extend beyond the first electrode 110 is that the capacitance of each individual memory cell is increased because of the larger surface area of the second electrodes 126. This may provide for better charge retention.

Figure 4A:
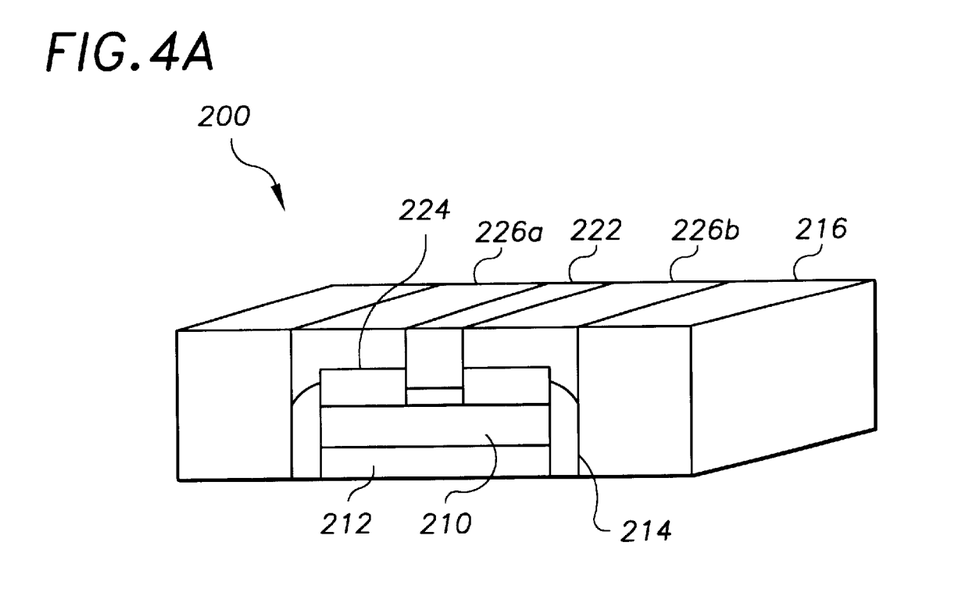
FIGS. 4A and 4B are perspective views of the memory cell assemblies of FIGS. 3A and 3B, respectively.

FIGS. 3A and 4A illustrate a memory cell assembly 200 have two individual memory cells 201a and 201b each having a second electrode 226a, 226b formed over a single first electrode 210. The second electrodes 226a, 226b are separated by a dielectric barrier 222 and the first electrode 210 is separated from the second electrodes 226a, 226b by a second dielectric layer 224.

Figure 4B:
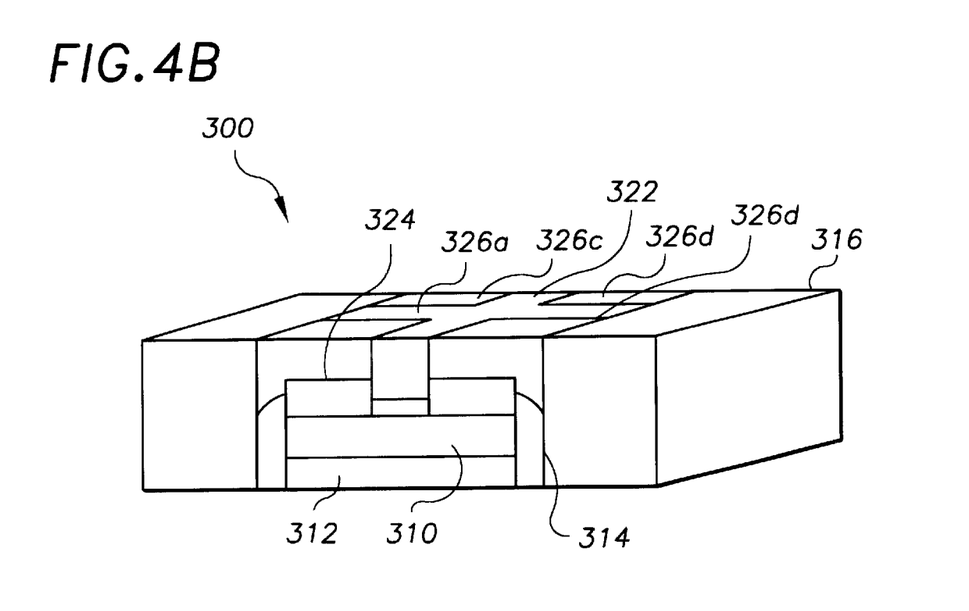

FIGS. 3B and 4B illustrate a memory cell assembly 300 with four individual memory cells 301a, 301b, 301c, and 301d each having a second electrode 326a, 326b, 326c, 326d formed over a single first electrode 310. Other memory cell assemblies can be formed with different numbers of memory cells and/or different configurations of memory cells. Contacts (not shown) to each of the second electrodes 126 can be formed to complete the memory cell assembly 100.

The thickness of the second dielectric layer 124 and the dielectric constant of the dielectric material forming the second dielectric layer 124 often determines, at least in part, the programming voltage of an individual memory cell of the memory cell assembly 100. Typically, a memory cell can be programmed to have a value of "1" (or "0" depending on which value corresponds to an excess of electrons or holes on the second electrode 126) by providing a potential difference across the first and second electrodes 110, 126 (see FIG. 2F) that causes holes or electrons to be injected across the second dielectric layer 124. This programming voltage is usually considerably greater than the normal operating voltage. The programming voltage, however, is typically less than the memory cell breakdown voltage that corresponds to a voltage that causes holes or electrons to be transferred between second electrodes 126 through the dielectric barrier 122. The programming voltage can range from, for example, 6 to 12 volts, although, memory cell assemblies with higher or lower programming voltages can also be formed.

The programming of the memory cells can be erased by applying a potential between the first and second electrodes 110, 126 that causes any excess charge to dissipate. The memory cell can then be reprogrammed.

As noted above, the present invention is applicable to a number of different devices and systems which benefit from increased storage capacity. Accordingly, the present invention should not be considered limited to the particular examples described above, but rather should be understood to cover all aspects of the invention as fairly set out in the attached claims. Various modifications, equivalent processes, as well as numerous communication devices to which the present invention may be applicable will be readily apparent to those of skill in the art upon review of the present specification. The claims are intended to cover such modifications and devices.

We claim:

1. A memory cell assembly comprising:
a substrate;
a first floating-gate electrode disposed over the substrate;
a second electroder layer disposed over the first floating-gate electrode, the second electrode layer comprising a plurality of second electrodes, each second electrode forming an individual memory cell associated with the first floating-gate electrode;
spacer structures formed adjacent to the first electrode, wherein each of the second electrodes extends over at least a portion of the spacer structures; and
a dielectric material separating the first floating-gate electrode from the second electrodes and separating the second electrodes.

2. The memory cell assembly of claim 1, wherein the second electrode layer comprises two second electrodes.

3. A memory cell assembly comprising:
a substrate;
a first floating-gate electrode disposed over the substrate;
a second electrode layer disposed over the first floating-gate electrode, the second electrode layer comprising four second electrodes, each second electrode forming an individual memory cell associated with the first floating-gate electrode, and
a dielectric material separating the first floating-gate electrode from the second electrodes and separating the second electrodes.

4. The memory cell assembly of claim 1, wherein the dielectric material comprises first dielectric material separating the second electrodes and second dielectric material separating the first electrode from the second electrodes.

5. The memory cell assembly of claim 4, wherein the second dielectric material comprises an oxide.

6. The memory cell assembly of claim 4, wherein the second dielectric comprises an oxynitride.

7. The memory cell assembly of claim 5, further comprising a nitrogen-containing dielectric layer disposed between the first and second electrodes.

8. The memory cell assembly of claim 4, wherein the first dielectric material comprises an oxide material.

9. The memory cell assembly of claim 1, wherein the second electrodes are separated by at least 100 angstroms of the first dielectric material.

10. The memory cell assembly of claim 1, wherein the first electrode is separated from the second electrodes by at least 40 angstroms of the second dielectric material.

11. The memory cell assembly of claim 1, wherein a separation distance between the second electrodes is greater than a separation distance between the first electrode and the second electrodes.

12. The memory cell assembly of claim 1, further comprising spacer structures formed adjacent to the first electrode, wherein each of the second electrodes extends over at least a portion of the spacer structures.

13. The memory cell assembly of claim 1, wherein the first electrode comprises polysilicon.

14. The memory cell assembly of claim 1, wherein the second electrode comprises polysilicon or metal.

15. The memory cell assembly of claim 4, wherein the second dielectric material is composed of two portions, the first dielectric material being bounded by and in contact with each of the two portions.

16. The memory cell assembly of claim 15, wherein the two portions of the second dielectric material are formed directly on the first electrode.

17. A high-density memory cell assembly comprising:
a substrate;
an insulating layer formed over a portion of the substrate;
a first floating-gate electrode formed over the insulating layer;
a second electrode layer including four second electrodes and having a plurality of four second electrodes formed over the first floating-gate electrode, each second electrode forming an individual memory cell associated with the first floating-gate electrode;
a first dielectric material separating the second electrodes; and
a second dielectric material separating the first floating-gate electrode from the second electrodes.

18. The memory cell assembly of claim 17, wherein the second electrode layer comprises four second electrodes.

19. The memory cell assembly of claim 17, wherein the second dielectric material comprises an oxide.

20. The memory cell assembly of claim 17, wherein the second dielectric comprises oxynitride.

21. The memory cell assembly of claim 19, further comprising a nitrogen-containing dielectric layer disposed between the first and second electrodes.

22. The memory cell assembly of claim 17, wherein the first dielectric material comprises an oxide material.

23. The memory cell assembly of claim 17, wherein the second electrodes are separated by at least 100 angstroms of the first dielectric material.

24. The memory cell assembly of claim 17, wherein the first electrode is separated from the second electrodes by at least 40 angstroms of the second dielectric material.

25. The memory cell assembly of claim 17, wherein the first electrode comprises polysilicon.

26. The memory cell assembly of claim 17, wherein the second electrode comprises one of polysilicon and metal.

27. The memory cell assembly of claim 25, wherein the second electrode comprises one of polysilicon and metal.

28. The memory cell assembly of claim 17, wherein a third dielectric layer is formed between the first electrode and the first dielectric material.

29. The memory cell assembly of claim 17, wherein a third dielectric layer is formed over the first electrode and under the second dielectric material.

30. The memory cell assembly of claim 17, wherein a third dielectric layer is formed between the second dielectric layer and the second electrodes.

31. The memory cell assembly of claim 17, wherein a separation distance between the second electrodes is greater than a separation distance between the first electrode and the second electrodes.

32. A high-density memory cell assembly comprising:
a substrate;
an insulating layer formed over a portion of the substrate;
a first floating-gate electrode formed over the insulating layer;
a second electrode layer having a plurality of four second electrodes formed over the first floating-gate electrode, each second electrode forming an individual memory cell associated with the first floating-gate electrode;
a first dielectric material separating the second electrodes; and
a second dielectric material separating the first floating-gate electrode from the second electrodes, wherein the first dielectric material has a bottom surface that is below a top surface of the second dielectric material.

33. A high-density memory cell assembly comprising:
a substrate;
an insulating layer formed over a portion of the substrate;
a first floating-gate electrode formed over the insulating layer;
a second electrode layer having a plurality of four second electrodes formed over the first floating-gate electrode, each second electrode forming an individual memory cell associated with the first floating-gate electrode;
a first dielectric material separating the second electrodes;
spacer structures formed adjacent the first electrode, wherein each of the second electrodes extends over at least a portion of the spacer structures; and
a second dielectric material separating the first floating-gate electrode from the second electrodes.

34. A high-density memory cell assembly comprising:
a substrate;
an insulating layer formed over a portion of the substrate;
a first floating-gate electrode formed over the insulating layer;
a second electrode layer having a plurality of four second electrodes formed over the first floating-gate electrode, each second electrode forming an individual memory cell associated with the first floating-gate electrode;
a first dielectric material separating the second electrodes; and
a second dielectric material separating the first floating-gate electrode from the second electrodes, the second dielectric material being composed of two portions, the first dielectric material being bounded by and in contact with each of the two portions.

35. The memory cell assembly of claim 34, wherein the two portions of the second dielectric material are formed directly on the first electrode.

36. A high-density memory cell assembly comprising:
a substrate;
an insulating layer formed over a portion of the substrate;
a first floating-gate electrode formed over the insulating layer;
a second electrode layer having a plurality of second electrodes formed over the first floating-gate electrode, each second electrode having opposing lateral sides that extend not beyond edges of the first floating-gate electrode, each second electrode forming an individual memory cell associated with the first floating-gate electrode;
a first dielectric material separating the second electrodes; and
a second dielectric material separating the first floating-gate electrode from the second electrodes, the second dielectric material is composed of two portions formed directly on the first floating-gate electrode, the first dielectric material being bounded by and in contact with each of the two portions, and wherein the bottom surface of the two portions of the second dielectric material is below the top surface of the first floating-gate electrode, the first floating-gate electrode having a portion that protrudes vertically between the two portions of the second dielectric material.

37. The memory cell assembly of claim 36, wherein the second electrodes are formed over the top and sides of the two portions of the second dielectric material.

38. The memory cell assembly of claim 36, wherein each second electrode have opposing lateral sides that extend not beyond an edge of the first electrode.

39. A memory cell assembly comprising:

a substrate;

a first floating-gate electrode disposed over the substrate;

a second electrode layer disposed over the first floating-gate electrode, the second electrode layer comprising a plurality of second electrodes, each second electrode having an entire lateral side that extends at least as far as an edge of the first floating-gate electrode, the entire lateral side bounded by an insulating layer that is adjacent to the edge of the first floating gate electrode, each second electrode forming an individual memory cell associated with the first floating-gate electrode; and a dielectric material separating the first floating-gate electrode from the second electrodes and separating the second electrodes, the dielectric material comprising first dielectric material separating the second electrodes and second dielectric material separating the first floating-gate electrode from the second electrodes, wherein the second dielectric material is composed of two portions formed directly on the first floating-gate electrode, the first dielectric material being bounded by and in contact with each of the two portions, wherein the bottom surface of the two portions of the second dielectric material is below the top surface of the first floating-gate electrode, the first floating-gate electrode having a portion that protrudes vertically between the two portions of the second dielectric material.

40. The memory cell assembly of claim 39, wherein the second electrodes are formed over the top and sides of the two portions of the second dielectric material.

41. The memory cell assembly of claim 39, wherein each second electrode have opposing lateral sides that extend not beyond an edge of the first electrode.

* * * * *